(12) United States Patent
Takei et al.

(10) Patent No.: US 7,425,347 B2
(45) Date of Patent: Sep. 16, 2008

(54) COMPOSITION FOR FORMING ANTI-REFLECTIVE COATING FOR USE IN LITHOGRAPHY

(75) Inventors: Satoshi Takei, Funabashi (JP); Yoshiaki Yasumi, Nei-gun (JP); Ken-ichi Mizusawa, Chiyoda-ku (JP)

(73) Assignee: Nissan Chemical Industries, Ltd, Tokyo (JP)

( * ) Notice: Subject to any disclaimer, the term of this patent is extended or adjusted under 35 U.S.C. 154(b) by 498 days.

(21) Appl. No.: 10/491,954

(22) PCT Filed: Oct. 4, 2002

(86) PCT No.: PCT/JP02/10372

§ 371 (c)(1),
(2), (4) Date: Apr. 8, 2004

(87) PCT Pub. No.: WO03/034152

PCT Pub. Date: Apr. 24, 2003

(65) Prior Publication Data
US 2005/0008964 A1    Jan. 13, 2005

(30) Foreign Application Priority Data
Oct. 10, 2001    (JP)    ............... 2001-313089

(51) Int. Cl.
*B05D 3/02*    (2006.01)
*B05D 3/06*    (2006.01)
*C08L 63/00*    (2006.01)
*B32B 27/38*    (2006.01)

(52) U.S. Cl. ............... 427/97.7; 427/98.2; 427/98.4; 525/103; 525/523; 525/529; 428/413; 428/500

(58) Field of Classification Search ............... 525/107, 525/523, 529, 530, 533; 428/413, 500; 427/58, 427/96.1, 97.7, 98.2, 98.4, 99.2, 271, 272, 427/273, 282, 553; 438/689
See application file for complete search history.

(56) References Cited

U.S. PATENT DOCUMENTS

| | | | |
|---|---|---|---|
| 4,904,525 A * | 2/1990 | Taniguchi et al. | 428/328 |
| 5,693,691 A | 12/1997 | Flaim et al. | |
| 5,919,599 A | 7/1999 | Meador et al. | |
| 6,767,689 B2 * | 7/2004 | Pavelchek et al. | 430/271.1 |
| 7,026,101 B2 * | 4/2006 | Trefonas et al. | 430/322 |
| 2001/0022404 A1 * | 9/2001 | Yamamoto et al. | 257/783 |

FOREIGN PATENT DOCUMENTS

| | | |
|---|---|---|
| JP | A 11-154638 | 6/1999 |
| JP | A 2000-294504 | 10/2000 |
| JP | A 2001-22084 | 1/2001 |
| JP | A 2001-40293 | 2/2001 |
| JP | A 2001-81203 | 3/2001 |
| JP | A 2002-333717 | 11/2002 |

OTHER PUBLICATIONS

Taylor et al., "Methacrylate Resists and Antireflective Coatings for 193 nm Lithography," Part of the SPIE Conference on Advances in Resist Technology and Processing XVI Santa Clara, California, SPIE, vol. 3678 pp. 174-185, Mar. 1999.

Meador et al., "Recent Progress in 193 nm Antireflective Coatings," Part of the SPIE Conference on Advances in Resist Technology and Processing XVI Santa Clara, California, SPIE, vol. 3678 pp. 800-809, Mar. 1999.

Lynch et al., "Properties and Performance of Near UV Reflectivity Control Layers," SPIE, vol. 2195, pp. 225-229, 1994.

* cited by examiner

*Primary Examiner*—Michael J Feely
(74) *Attorney, Agent, or Firm*—Oliff & Berridge, PLC

(57) ABSTRACT

The present invention relates to a composition for forming anti-reflective coating for use in a lithography process in manufacture of a semiconductor device which comprises polymer (A) having a weight average molecular weight of 5,000 or less, and a polymer (B) having a weight average molecular weight of 20,000 or more. The composition provides an anti-reflective coating for use in a lithography which is excellent in step coverage on a substrate with an irregular surface, such as hole or trench, has a high anti-reflection effect, causes no intermixing with a resist layer, provides an excellent resist pattern, and has a higher dry etching rate compared with the resist layer.

16 Claims, 1 Drawing Sheet

COMPOSITION FOR FORMING ANTI-REFLECTIVE COATING FOR USE IN LITHOGRAPHY

TECHNICAL FIELD

The present invention relates to a novel composition for anti-reflective coating material, particularly to an anti-reflective coating for use in lithography that is excellent in coating performance on a substrate having irregularity, such as holes or trenches, has a high anti-reflective effect, causes no intermixing with a resist layer to give an excellent resist pattern, and has a higher dry etching rate compared with the resist, and more particularly to anti-reflective coating for use in dual damascene process for introducing Cu (copper) as wiring material used for reducing wiring delay in semiconductor devices particularly in recent years.

BACKGROUND ART

Conventionally, in the manufacture of semiconductor devices, micro-processing by lithography using a photoresist composition has been carried out. The micro-processing is a processing method including forming a thin film of a photoresist composition on a silicon wafer, irradiating actinic rays such as ultraviolet rays through a mask pattern depicting a pattern for a semiconductor device, developing it to obtain a resist pattern, and etching the silicon wafer using the resist pattern as a protective film. However, in recent progress in high integration of semiconductor devices, there has been a tendency that shorter wavelength actinic rays are being used, i.e., KrF excimer laser beam (248 nm) and further ArF excimer laser beam (193 nm) have been taking the place of i-line (365 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC).

As the anti-reflective coating, inorganic anti-reflective coatings made of titanium, titanium dioxide, titanium nitride, chromium oxide, carbon or α-silicon and organic anti-reflective coatings made of a light-absorbing substance and a high molecular compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule as disclosed in U.S. Pat. No. 5,919,599 and the novolak resin type anti-reflective coating having a hydroxyl group being a crosslinking reaction group and a light absorbing group in the same molecule as disclosed in U.S. Pat. No. 5,693,691, and so on.

The physical properties desired for organic anti-reflective coating materials include high absorbance to light and radioactive rays, no intermixing with the resist layer (being insoluble in resist solvents), no diffusion of low molecular substances from the anti-reflective coating material into the topcoat resist upon coating or heat-drying, and a higher dry etching rate than the resist. They are described in, for example, Proc. SPIE, Vol. 3678, 174-185 and 800-809 (1999) and Proc. SPIE, Vol. 2195, 225-229 (1994).

Wiring delay has a more adverse effect on high-speed performance of LSI in LSI pattern rule having a fineness of 0.13 μm or less, and it becomes difficult to proceed an improvement in performance of LSI due to the present status of LSI process technique. Materials used for reducing wiring delay are a wiring material Cu and an interlayer insulating film having a low dielectric constant. And, a technique introduced for changing from Al (aluminum) as a wiring material to Cu is dual damascene process. The dual damascene process requires the use of an anti-reflective coating applied on a substrate having a larger aspect ratio (irregularity) compared with a substrate produced by using the conventional wiring material Al.

For anti-reflective coatings for dual damascene process, it is required to control a shape of an anti-reflective coating applied at the periphery of holes on a primary substrate. There are known the following two methods and anti-reflective coatings for controlling a shape of an anti-reflective coating applied at the periphery of holes on a primary substrate.

One of them is a method of full-fill type in which an anti-reflective coating is used in such a manner that holes are fully filled with the anti-reflective coating to make the surface of a substrate planarized. In this method, it is desirable to fill approximately 100% of holes with the anti-reflective coating. The merit of this method is advantages in lithographic process, while the demerit is disadvantages in etching process.

Another is a method of partial-fill type in which an anti-reflective coating is used in such a manner that holes are partially filled with the anti-reflective coating to cover the bottom parts and edge upper parts of the holes.

In this method, it is desirable that the filling rate of holes is around 20 to 80%. The merit of this method is advantages in semiconductor production that as the filling rate of holes is 20 to 80%, etching process for removing the anti-reflective coating can be carried out for a shorter time compared with a case where the filling rate of holes is approximately 100%. However, the demerit is disadvantages in lithography process in terms of an anti-reflective effect as a substrate having holes is not completely planarized. In addition, this method is generally used for substrates with a low integrated degree of a wiring width of 0.3 μm or more, because the method of partial-fill type often requires simultaneous use of another anti-reflective coating in order to use in a part of the substrate with a high integrated degree of a wiring width of 0.2 μm or less, unlike in the case where the anti-reflective coating in full-fill type is used in a part of the substrate with a high integrated degree of a wiring width of 0.2 μm or less.

As demand characteristics for the material for forming anti-reflective coating used in the partial-fill type, it is important to have the following performances when the anti-reflective coating is applied at a constant thickness:

(1) the filling amount of anti-reflective coating in holes is 20 to 80%, preferably 30 to 70% based on the volume of holes;
(2) the anti-reflective coating filled in holes has no void or gap;
(3) no anti-reflective coating is adhered to the side wall of holes;
(4) the edge upper part of the holes is covered with anti-reflective coating;
(5) anti-reflective coating has a constant thickness regardless of the density of holes on a substrate; and
(6) no resist poising occurs.

The anti-reflective coating fully satisfying these six performances is needed.

In particular, materials for forming anti-reflective coating require the followings when an anti-reflective coating is applied at a constant thickness the filling rate of holes with anti-reflective coating is 20 to 80%, preferably 30 to 70% based on the volume of holes;

no void or gap is present in holes; and the anti-reflective coating has a constant thickness regardless of the density of holes on a substrate.

As an example in which the conventional material for forming anti-reflective coating used in the partial-fill type is used, for example Japanese Patent Laid-open No. 2000-294504 discloses a method for forming photoresist relief image over a substrate having topography in which (a) a layer of anti-reflective composition containing a polymer having a molecular weight of about 8,000 or less is applied on the substrate; (b) a photoresist layer is applied on the layer of anti-reflective composition; and (c) the photoresist layer is exposed to an activated radiation, and the exposed photoresist layer is developed. The publication describes a preferable embodiment in which an anti-reflective composition exhibits a degree of planarization of about 0.5 or more for a step having slope shape formed by a local oxidation of silicon and a width of 0.8 μm and a depth at middle point of 2 μm. However, the publication does not describe the formation of void or gap of air that has a tendency to exert an adverse effect when the anti-reflective coating is applied and that is an important point in a case where the material for forming anti-reflective coating is used in partial-fill type, and nor describe whether or not the thickness of the anti-reflective coating is constant regardless of the density of holes on a substrate.

An object of the present invention is to provide a composition for forming anti-reflective coating for use in lithography which has a filling rate of holes with anti-reflective coating of 20 to 80% and no void or gap of air in the holes when the anti-reflective coating is applied at a constant thickness; gives an anti-reflective coating having a constant thickness regardless of the density of holes on the substrate; has a high prevention effect of reflected light; causes no intermixing with a resist layer; provide an excellent resist pattern; and has a higher dry etching rate compared with the resist, and to provide a method for forming resist pattern by using the composition for forming anti-reflective coating.

That is, polymers and compositions for forming anti-reflective coating disclosed in the present application are more appropriate for the anti-reflective coating of partial-fill type that is used to obtain anti-reflective performance and a high dry etching rate for applying to semiconductor devices having a relatively wide wiring width, rather than for the anti-reflective coating of full-fill type that is used to obtain anti-reflective performance by fully filling holes on a substrate and planarizing it for applying to semiconductor devices having a relatively narrow wiring width.

DISCLOSURE OF INVENTION

The present invention relates to the following aspects:

as a first aspect, a composition for forming anti-reflective coating, comprising a polymer (A) having a weight average molecular weight of 5,000 or less, and a polymer (B) having a weight average molecular weight of 20,000 or more;

as a second aspect, the composition for forming anti-reflective coating as described in the first aspect, wherein the polymer (A) is a halogenated bisphenol A resin having a weight average molecular weight of 700 to 5,000;

as a third aspect, the composition for forming anti-reflective coating as described in the second aspect, wherein the halogenated bisphenol A resin comprises at least a polymer of formula (1):

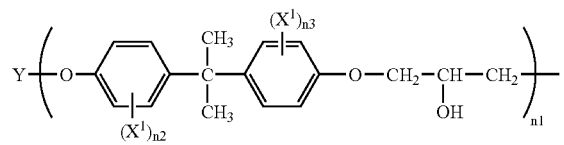
Formula (1)

wherein $X^1$ is a halogen atom, n1 is the number of repeated units and an integer of 1 to 50, n2 and n3 is the number of substituent $X^1$ on a benzene ring and an integer of 1 to 3, and Y is a group of formula (2)

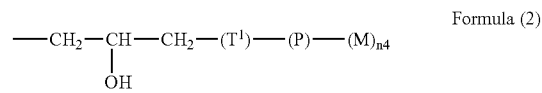
Formula (2)

wherein $T^1$ is a divalent linking group, P is a (n4+1) valent aromatic ring group having 6 to 14 carbon atoms, M is an electron-donating group, n4 is the number of substituent M on P and an integer of 0 to 3, in a case where n4 is 2 or 3, substituents M are the same or different from each other;

as a fourth aspect, the composition for forming anti-reflective coating as described in the first aspect, wherein the polymer (A) is a halogen-containing novolak resin having a weight average molecular weight of 600 to 5,000;

as a fifth aspect, the composition for forming anti-reflective coating as described in the fourth aspect, wherein the halogen-containing novolak resin is a polymer having at least a repeated unit of formula (3):

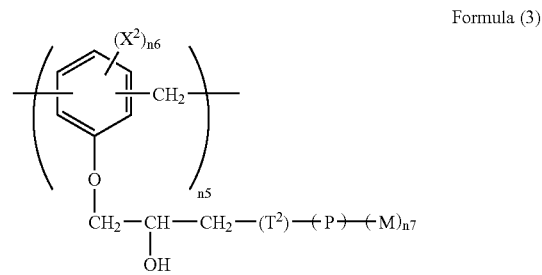
Formula (3)

wherein $T^2$ is a divalent linking group, $X^2$ is chlorine atom or bromine atom, n5 is the number of repeated units, n6 is the number of substituent $X^2$ on a benzene ring and an integer of 1 to 3, P is a (n7+1) valent aromatic ring group having 6 to 14 carbon atoms, M is an electron-donating group, n7 is an integer of 0 to 3, in a case where n7 is 2 or 3, a plurality of M are the same or different from each other;

as a sixth aspect, the composition for forming anti-reflective coating as described in any one of the first to fifth aspects, wherein the polymer (B) is a polyacrylate or polymethacrylate having a weight average molecular weight of 20,000 to 200,000;

as a seventh aspect, the composition for forming anti-reflective coating as described in any one of the first to fifth aspects, wherein the polymer (B) is a polystyrene or a derivative thereof having a weight average molecular weight of 20,000 to 200,000;

as an eighth aspect, the composition for forming anti-reflective coating as described in any one of the first to seventh aspects, containing the polymer (A) in an amount of 33.7 to 83.2% by weight and the polymer (B) in an amount of 66.3 to 16.8% by weight;

as a ninth aspect, the composition for forming anti-reflective coating as described in any one of the first to eighth aspects, further containing a crosslinking agent having at least two crosslink-forming functional groups;

as a tenth aspect, the composition for forming anti-reflective coating as described in any one of the first to ninth aspects, wherein the composition is used for a production of a semiconductor device by a method comprising covering a substrate having holes of an aspect ratio indicated by height/diameter of 1 or more with a photoresist, and transferring an image on the substrate by utilizing lithography process, and the composition is used for partially filling the holes on the substrate prior to a covering with the photoresist;

as an eleventh aspect, the composition for forming anti-reflective coating as described in the tenth aspect, wherein the filling of the holes is carried out in a rate of 20 to 80% based on a volume per hole; and as a twelfth aspect, a process for manufacturing a semiconductor device by transferring an image on a substrate and forming an integrated circuit element, comprising the steps (I), (II) and (III) of:

Step (I): a step comprising coating the composition for forming anti-reflective coating as described in any one of the first to ninth aspects on a substrate having an aspect ratio indicated by height/diameter of 1 or more, and drying the composition to fill 20 to 80% of a volume of holes on the substrate with the anti-reflective coating;

Step (II): a step comprising coating a resist and drying it; and

Step (III): a step comprising exposing to light, developing and etching.

The present invention relates to a composition for forming anti-reflective coating for use in a lithographic process in manufacture of a semiconductor device, comprising a polymer (A) having a weight average molecular weight of 5,000 or less, and a polymer (B) having a weight average molecular weight of 20,000 or more. As the polymers, polymers having halogen atoms in the main chain thereof can be preferably used.

Although the polymer (A) having a weight average molecular weight of 5,000 or less for forming the anti-reflective coating of the present invention may vary depending on the coating solvents used, the viscosity of the solution, the shape of the coating, etc., a novolak resin, a bisphenol A resin, a polyester resin or a polyether resin, etc. can be preferably used.

Although the polymer (B) having a weight average molecular weight of 20,000 or more for forming the anti-reflective coating of the present invention may vary depending on the coating solvents used, the viscosity of the solution, the shape of the coating, etc., an acrylic resin, a polyester resin, a polyvinyl phenol resin or a polyimide resin, etc. can be preferably used.

In particularly, it is preferable that the above-mentioned polymers comprise a halogen-containing novolak resin and/or the derivative thereof, and an acrylic resin and/or the derivative thereof.

The weight ratio of polymers in the resulting anti-reflective coating is 33.7 to 83.2% by weight of the polymer (A) having a weight average molecular weight of 5,000 or less and 16.8 to 66.3% by weight of the polymer (B) having a weight average molecular weight of 20,000 or more, preferably 50.0 to 75.0% by weight of the polymer (A) having a weight average molecular weight of 5,000 or less and 25.0 to 50.0% by weight of the polymer (B) having a weight average molecular weight of 20,000 or more.

The composition for forming anti-reflective coating according to the present invention contains the above-mentioned polymers and a solvent, and may further contain a crosslinking agent, other additives, etc. A solid content in the composition for forming anti-reflective coating according to the present invention is 0.1 to 50% by weight. In addition, the content of the above-mentioned polymers is 0.1 to 50 parts by weight, preferably 1 to 30 parts by weight based on 100 parts by weight of the whole composition.

The polymers in the present invention may be any of random copolymers, block copolymers and graft copolymers. The polymers for forming the anti-reflective coating of the present invention can be synthesized by various methods such as radical polymerization, anionic polymerization or cationic polymerization. As the type of polymerization, various methods such as solution polymerization, suspension polymerization, emulsion polymerization or bulk polymerization are possible.

As the polymer (A), for example halogenated bisphenol A resins having a weight average molecular weight of 700 to 5,000 can be used.

The halogenated bisphenol A resins are preferably polymers of at least formula (1).

The halogenated bisphenol A resins can be synthesized by a polycondensation of a halogenated bisphenol A with epichlorohydrin. The halogenated bisphenol A includes for example tetrabromobisphenol A or tetrachlorobisphenol A, and as goods on the market, halogenated bisphenol A resins having a halogen content of 46 to 52% and an epoxy equivalent of 330 to 700 g/eq are easily available.

The halogenated bisphenol A resins have epoxy groups at the terminals, at least one of the epoxy groups may be reacted with a compound that reacts with the epoxy group.

The terminal structure of the halogenated bisphenol A resins is preferably the structure of formula (2) having a light-absorbing moiety.

In formula (1), $X^1$ is a halogen atom, such as bromine atom, chlorine atom, etc., n1 is the number of repeated units, and is 1 to 50, preferably 1 to 10, n2 and n3 are the number of substituents substituted by halogen atoms on the benzene ring, and are 1 to 3, preferably 2.

In formula (2), P is a (n4+1) valent aromatic ring group having 6 to 14 carbon atoms, for example a light absorbing group, such as benzene ring, naphthalene ring, anthracene ring, etc.

M is an electron-donating group. M includes for example substituents, such as —OH, —OR$^2$, —R$^2$, —N(R$^3$)(R$^4$) or —SR$^4$, R$^2$ is a hydrocarbon group having carbon atom of 1 to 20, R$^3$ and R$^4$ may be the same or different from each other, and are hydrogen atom or a hydrocarbon group having carbon atom of 1 to 20. The above-mentioned M includes for example methyl, ethyl, butyl, hydroxy, methoxy, ethoxy, allyl, vinyl, amino, etc. n4 is the number of substituent M on P, and is an integer of 0 to 3. In a case where n4 is 2 to 3, M may be the same or different from each other.

It is necessary that at least one epoxy group at both terminals of the halogenated bisphenol A resin has the structure which Y in formula (1) is the group of formula (2) by reaction with an aromatic compound, such as an aromatic organic acid, an aromatic amine, aromatic alcohol, etc. As these aromatic compounds, there can be used compounds substituted with one or two functional groups, such as carboxyl group, sulfonic group, amino group, hydroxy group, etc. on an aromatic ring, such as benzene ring, naphthalene ring, anthracene ring, etc. These are aromatic compounds having an absorption at an ultraviolet portion, for example benzoic acid, benzenesulfonic acid, aniline, benzyl amine, phenol, naphthalenecarboxylic acid, naphthyl acetic acid, naphthalenesulfonic acid, naphthyl amine, naphthol, anthracenecarboxylic acid, anthracenesulfonic acid, aminoanthracene, hydroxyanthracene and derivatives thereof. When the structure which the portion of Y is the group of formula (2) is formed by reacting these aromatic compounds with a halogenated bisphenol A resin, divalent linking group ($T^1$) has a structure, such as —O—CO—, —$SO_2$—O—, —NH—, —O—, etc.

Among the aromatic compounds, 9-anthracenecarboxylic acid is particularly preferable. In a case where 9-anthracenecarboxylic acid is used, ($T^1$) in formula (2) is —O—CO— and (P) is anthryl.

The other epoxy group at both terminals of the halogenated bisphenol A resin can react with an aliphatic organic acid, an aliphatic alcohol, an aliphatic amine or water. The reaction leads to the structure of formula (4)

Depending on the reaction condition, the other epoxy group at both terminals of the halogenated bisphenol A resin may be in an unreacted state. In this case, Y in formula (4) has a structure of formula (5)

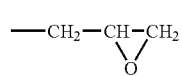

Formula (5)

Therefore, the halogenated bisphenol A resin used in the present invention has structures of formulae (2), (5) and (6) at both terminals Y in formula (4). As to these terminals Y, the proportion of formula (2): formula (5): formula (6) is 0.5-1.0: 0-0.5:0-0.5, preferably 0.8-1.0:0-0.2:0-0.2 in molar number of each repeated unit in a case where the total molar number of formulae (2), (5) and (6) is set to 1.

The halogenated bisphenol A resin used in the present invention is preferably a resin having a structure of formula (7)

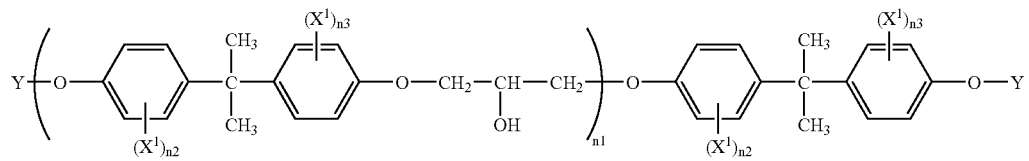

Formula (4)

wherein Y is a group of formula (6)

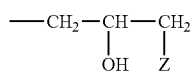

Formula (6)

In formula (6), Z is a substituent, such as RCOO—, RO—, RNH—, HO—, etc. in which R is a group of a hydrocarbon that may be substituted.

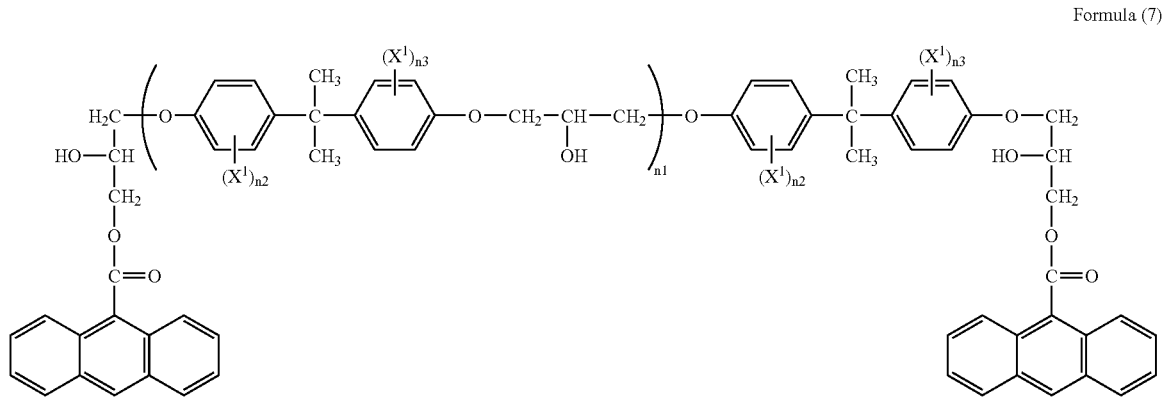

Formula (7)

obtained by reacting epoxy groups at both terminals with 9-anthracenecarboxylic acid.

In addition, also resins having a structure of formula (8)

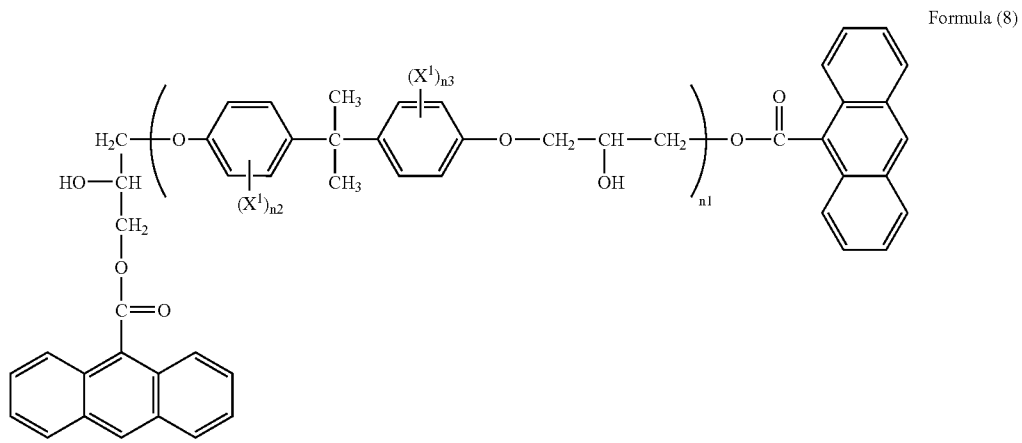

Formula (8)

can be used.

The hydroxy groups in the structure of the above-mentioned halogenated bisphenol A resin can be reacted with a crosslink-forming functional group in a crosslinking agent to form a crosslinking structure in the resulting anti-reflective coating.

It is essential that at least one Y has a structure of formula (2) by reacting an epoxy group at a terminal of the halogenated bisphenol A resin with an aromatic compound having a light absorption. There are cases where Ys at both terminals have the structure of formula (2), where one Y has the structure of formula (2) and the other Y has the structure of formula (5), and where one Y has the structure of formula (2) and the other Y has the structure of formula (6).

As halogen atoms having a large atomic weight, particularly bromine atoms are contained in the composition of the present invention, an anti-reflective coating formed from the composition has a high dry etching rate. In order to improve a rate of light absorbing groups per unit weight of a composition for forming anti-reflective coating, it is preferable that a rate of formula (2) is higher in the portion of Y in the halogenated bisphenol A resin.

The halogenated bisphenol A resin is produced by polymerization of a halogenated bisphenol A, such as tetrabromobisphenol A with chloromethyloxirane, such as epichlorohydrin.

For example, the polymer (A) may be a halogen-containing novolak resin having a weight average molecular weight of 700 to 5,000.

The halogen-containing novolak resin is a polymer having at least a repeated unit of formula (3).

The halogen-containing novolak resin may further contain, in addition to a repeated unit of formula (3), repeated units of formulae (9) and (10)

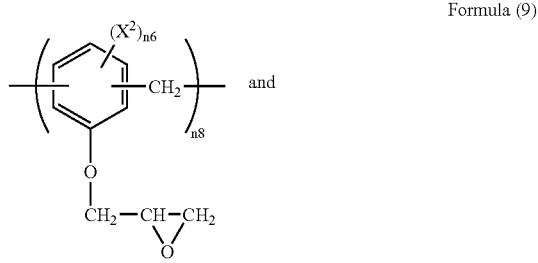

Formula (9)

and

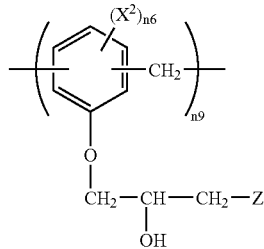

Formula (10)

wherein $X^2$ is chlorine atom or bromine atom, n6 is the number of substituent $X^2$ on a benzene ring and an integer of 1 to 3, Z is a substituent, such as RCOO—, RO—, RNH—, HO—, etc., n8, n9 and n5 are molar numbers of each repeated units in a case where total molar number of repeated units of formulae (3), (9) and (10) is set to 1, the sum of n8, n9 and n9 is 1, n8 is 0 to 0.8, n9 is 0 to 0.8 and n5 is 0.2 to 1.0.

The halogen-containing novolak resin can be easily produced by preparing a halogen-containing novolak resin having an epoxy group of formula (9), and carrying out an addition reaction of it with a compound that reacts with the epoxy group to convert into a compound having repeated units of formulae (3) and (10). In this process, a resin having repeated units of formulae (3) and (10) is produced by using at least one compound that reacts with the epoxy group.

The repeated unit of formula (3) is a moiety to which a light absorbing material is bound, and is obtained by subjecting the resin of formula (9) to an addition reaction with a light absorbing material. The light absorbing material is a compound substituted with one or more functional groups, such as carboxyl group, sulfonic group, amino group, hydroxy group, etc on benzene ring, naphthalene ring, anthracene ring or pyrene ring. These compounds may be further substituted with —$OR^2$, —$N(R^3)(R^4)$ or —$SR^4$ wherein $R^2$ is a group of a hydrocarbon having carbon atom of 1 to 20, and $R^3$ and $R^4$ are the same or different from each other, hydrogen atom or a group of hydrocarbon of carbon atom of 1 to 20.

After these light absorbing materials are reacted with the epoxy group in formula (9), a divalent linking group ($T^2$) has a structure of —O—CO—, —$SO_2$—O—, —NH—, —O—, etc.

These light absorbing materials have carboxyl group or a functional group that can be converted into carboxyl group, and preferably reacts with an epoxy group in formula (9) to be bonded thereto. The carboxyl group or functional group that can be converted into carboxyl group is added to the epoxy group in the resin of formula (9) to form the resin having the repeated unit of formula (3). Particularly preferable light absorbing material is 9-anthracenecarboxylic acid, and affords a resin of formula (11)

erably 0-0.1:0-0.1:0.9-1 in molar number of each repeated unit in a case where the total molar number of formulae (3), (9) and (10) is set to 1, and n8+n9+n5 equals 1.

Also in formula (11), the molar ratio of n10: n11: n12 is 0-0.8:0-0.8:0.2-1, preferably 0-0.2:0-0.2:0.8-1, more preferably 0-0.1:0-0.1:0.9-1 in molar number of each repeated unit in a case where the total molar number of repeated units constituting the resin is set to 1, and n10+n11+n12 equals 1.

The repeated unit of formula (3) is essential for bonding a light absorbing material to the halogen-containing novolak resin having the epoxy group of formula (9) by addition reaction. When the light absorbing materials are bound to all epoxy groups by addition reaction, the number of the repeated unit of formula (9) is zero. The structural unit consisted of formulae (3), (9) and (10) is represented by the proportion of each repeated unit in a case where the total molar number of formulae (3), (9) and (10) is set to 1, that is, in a case where the total molar number of the repeated unit in each monomer constituting the resulting resin is set to 1, As the present invention uses resins containing halogen atoms having a large atomic weight, particularly bromine Formula (11)

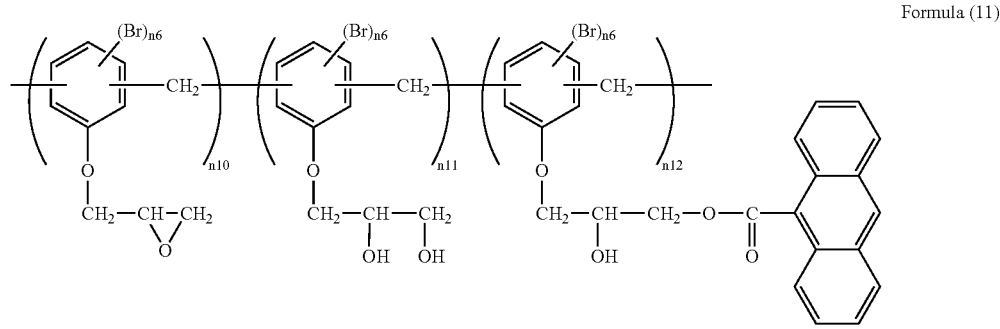

wherein n10, n11 and n12 are molar numbers of each repeated units in a case where total molar number of repeated units constituting the resin is set to 1, the sum of n10, n11 and n12 is 1, n10 is 0 to 0.8, n11 is 0 to 0.8 and n12 is 0.2 to 1.0, n6 is the number of bromine atoms substituted on the benzene ring and an integer of 1 to 3.

In a case where 9-anthracenecarboxylic acid is used, ($T^2$) in formula (3) is —O—CO— and (P) is anthryl.

A light absorbing material having carboxyl group or a functional group that can be converted into carboxyl group is bound to a resin having the repeated unit of formula (9) by addition reaction to give a resin having the repeated unit of formula (3). In this case, epoxy groups remaining on the resin having the repeated unit of formula (9) can be subjected to hydrolysis to form the repeated unit of formula (10) (Z=OH) to which a hydroxy group is added.

In addition, the repeated units of formulae (3) and (10) are also moieties to which a crosslinking reactive group (a hydroxy group) is bound.

The repeated units of formulae (3) and (10) are structural units affording light absorption and regulate the rate of crosslinking reaction with a crosslinking agent. That is, the crosslinking reaction rate is regulated by varying molar number of each repeated unit of formulae (3) and (10) in a case where the total molar number of formulae (3) and (10) is set to 1.

In formulae (3), (9) and (10), the molar ratio of n8: n9: n5 is 0-0.8: 0-0.8: 0.2-1, preferably 0-0.2:0-0.2:0.8-1, more prefatoms, many repeated units of formula (3) are required to be contained in the structure in order to improve the proportion of light absorbing groups per unit weight of anti-reflective coating material when an anti-reflective coating material containing the resins is applied.

It can be preferably used the resin of formula (12) produced by bonding only light absorbing materials to all or a part of epoxy groups in the resin of formula (9) and converting into the repeated unit of formula (3).

Formula (12)

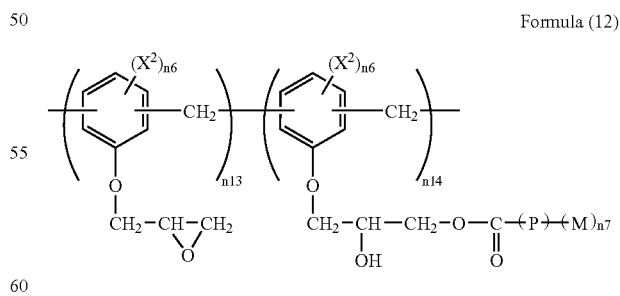

wherein $X^2$ is chlorine atom or bromine atom, n6 is the number of substituent $X^2$ on a benzene ring and an integer of 1 to 3, P is a (n7+1) valent aromatic ring group having 6 to 14 carbon atoms, M is an electron-donating group, n7 is an integer of 0 to 3, in a case where n7 is 2 or 3, a plurality of M are the same or different from each other, n13 and n14 are molar numbers of each repeated units in a case where total molar number of repeated units of monomers constituting the resin is set to 1, the sum of n13 and n14 is 1, n13 is 0 to 0.8 and n14 is 0.2 to 1.0.

In the resin of formula (12), the resins of formula (13) produced under a condition causing no hydrolysis can be preferably used.

Formula (13)

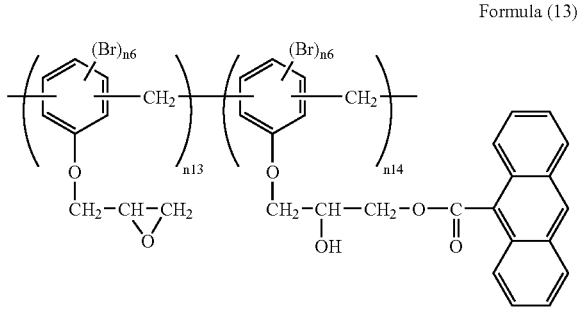

In the meantime, n8, n9 and n5 are the proportion of each repeated unit of formulae (9), (10) and (3) in the resulting resin, and there may be present not only in the structure composed of—repeated unit of formula (9)—repeated unit of formula (10)—repeated unit of formula (3)—but also in the structure composed of arbitrary combinations, such as the structure composed of—repeated unit of formula (9)—repeated unit of formula (3)—repeated unit of formula (10)—, —repeated unit of formula (9)—repeated unit of formula (3)—repeated unit of formula (3)—repeated unit of formula (10)—, —repeated unit of formula (9)—repeated unit of formula (3)—or —repeated unit of formula (9)—repeated unit of formula (3)—repeated unit of formula (3)—. The resins may be in any structures so long as the molar portion of n8: n9: n5 is 0-0.8:0-0.8:0.2-1.

The resin of formula (3) is synthesized by reacting a resin of formula (9) with a light absorbing material in a solvent, such as propylene glycol monomethyl ether or propylene glycol monomethyl ether acetate in the presence of a catalyst, such as benzyltriethylammonium chloride or tetramethylammonium hydroxide at a temperature of 100 to 130° C. under a normal pressure for 12 to 48 hours.

The polymer (B) used in the present invention has a weight average molecular weight of 20,000 or more. A light absorbing material corresponding to the above-mentioned P may be bound to the polymer (B). For example, a light absorbing material corresponding to the above-mentioned P can be bound to a structural unit having a glycidyl group by addition reaction to obtain a polymer (B) having a light absorbing moiety. However, the polymer (B) does not necessarily require to possess a light absorbing moiety.

The polymer (B) needs to have a crosslink-forming functional group, such as hydroxy group, and can be obtained by polymerizing monomers having hydroxy group or monomers having a functional group that causes hydroxy group by a reaction.

As the polymer (B), for example acrylic ester or methacrylic ester having a weight average molecular weight of 20,000 to 200,000 can be used.

Poly(meth)acrylates as the polymer (B) that can be used are for example poly(meth)acrylate having a hydroxy group or poly(meth)acrylate having an epoxy group.

These compounds can be produced by polymerizing solely hydroxymethyl methacrylate, hydroxyethyl methacrylate, hydroxypropyl methacrylate, hydroxybutyl methacrylate, hydroxypentyl methacrylate, hydroxyphenyl methacrylate, hydroxypropyl acrylate, glycidyl acrylate, glycidyl methacrylate or the like, or by copolymerizing two or more of these monomers.

The polymer (B) used in the present invention includes for example polystyrene or a derivative thereof having a weight average molecular weight of 20,000 to 200,000. These resins may be polyhydroxystyrenes having a functional group, such as hydroxy group which can form a crosslink with a crosslinking agent.

It is possible to copolymerize monomers other than the above-described monomers into the polymer (B). This allows minute adjustment of crosslinking reaction rate, dry etching rate, reflectivity, etc. Such a copolymerizable monomer includes, for example, compounds having at least one addition polymerizable unsaturated bond selected from acrylic acid, methacrylic acid, maleic acid, fumaric acid, acrylic acid esters, acrylamides, methacrylic acid esters, methacrylamides, allyl compounds, vinyl ethers, vinyl esters, styrenes, crotonic acid esters, etc.

The acrylic acid esters include, for example, alkyl acrylates having 1 to 10 carbon atoms in the alkyl group.

The methacrylic acid esters include, for example, alkyl methacrylates having 1 to 10 carbon atoms in the alkyl group.

The acrylamides include, for example, acrylamide, N-alkylacrylamides, N-arylacrylamides, N,N-dialkylacrylamides, N,N-diarylacrylamides, N-methyl-N-phenylacrylamide, N-2-acetamide ethyl-N-acetylacrylamide, etc.

The methacrylamides include, for example, methacrylamide, N-alkylmethacrylamides, N-arylmethacrylamides, N,N-dialkylmethacrylamides, N,N-diarylmethacrylamides, N-methyl-N-phenylmethacrylamide, N-ethyl-N-phenylmethacrylamide, etc.

The vinyl ethers include, for example, alkyl vinyl ethers, vinyl aryl ethers, etc.

The vinyl esters include, for example, vinyl butyrate, vinyl isobutyrate, vinyl trimethylacetate, etc.

The styrenes include, for example, styrene, alkylstyrenes, alkoxystyrenes, halogenated styrenes, carboxystyrenes, etc.

The crotonic acid esters include, for example, alkyl crotonates such as butyl crotonate, hexyl crotonate, glycerin monocrotonate, etc.

Also, mention may be made of dialkyl itaconates, monoalkyl esters or dialkyl esters of maleic acid or fumaric acid, maleimide, acrylonitrile, methacrylonitrile, maleylonitrile, etc. In addition, generally, addition polymerizable unsaturated compounds may be used.

The anti-reflective coating forming composition of the present invention may further contain a crosslinking agent having at least two crosslink-forming functional groups. The crosslinking agent includes, for example, melamines, substituted ureas, polymers having epoxy groups and the like. The agent is preferably methoxymethylated glycoluril, methoxymethylated melamine or the like, more preferably tetramethoxymethyl glycoluril or hexamethoxymethyl melamine. The addition amount of the crosslinking agent may vary depending on the coating solvents used, the underlying substrate used, the viscosity of the solution required, the shape of the coating required, etc., and usually 0.001 to 20 parts by weight, preferably 0.01 to 10 parts by weight, more preferably 0.1 to 5.0 parts by weight based on 100 parts by weight of the total composition.

As catalyst for promoting the above-mentioned crosslinking reaction in the anti-reflective coating forming composition of the present invention, acid compounds, such as p-toluenesulfonic acid, trifluoromethanesulfonic acid, pyridinium p-toluenesulfonate, salicylic acid, sulfosalicylic acid, citric acid, benzoic acid, hydroxybenzoic acid, etc. or/and thermal acid generators, such as 2,4,4,6-tetrabromocyclohexadienone, benzointosylate, 2-nitrobenzyltosylate, etc. may be added. The blending amount thereof is 0.02 to 10 parts by weight, preferably 0.04 to 5 part by weight based on 100 parts by weight of the total solid content.

The anti-reflective coating forming composition of the present invention may contain further light absorbing agents, rheology controlling agents, adhesion auxiliaries, surfactants, etc. in addition to the above described ones, if necessary.

As the further light absorbing agents, the followings can be suitably used: for example commercially available light absorbing agents described in "Technique and Market of Industrial Pigments" (CMC Publishing Co., Ltd.) or "Dye Handbook" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; C. I. Pigment Brown 2, and the others. The light absorbing agent is usually blended in an amount of 10 parts by weight or less, preferably 5 parts by weight or less based on 100 parts by weight of the total composition.

The rheology controlling agents are added mainly aiming at increasing the flowability of the anti-reflective coating forming composition and in particular in the baking step, increasing filling property of the anti-reflective coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 parts by weight based on 100 parts by weight of the total composition.

The adhesion auxiliaries are added mainly for the purpose of increasing the adhesion between the substrate or resist and the anti-reflective coating forming composition, in particular preventing the detachment of the resist in development. Specific examples thereof include chlorosilanes such as trimethylchlorosilane, dimethylvinylchlorosilane, methyldiphenylchlorosilane or chloromethyldimethyl-chlorosilane; alkoxysilanes such as trimethylmethoxysilane, dimethyldiethoxysilane, methyldimethoxysilane, dimethylvinylethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxy-silane or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 5 parts by weight, preferably less than 2 parts by weight, based on 100 parts by weight of the total composition of the anti-reflective coating for lithography.

The anti-reflective coating forming composition of the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC R08, R30, LS-14 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 1 part by weight or less, preferably 0.5 part by weight or less, based on 100 parts by weight of the total composition of the present invention. The surfactants may be added singly or two or more of them may be added in combination.

In the present invention, as the solvents for dissolving the above-described resin, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methylpyruvate, ethyl pyruvate, ethyl acetate, butyl acetate, ethyl lactate, butyl lactate, etc. The organic solvents may be used singly or in combination of two or more of them.

Further, high boiling solvents such as propylene glycol monobutyl ether or propylene glycol monobutyl ether acetate may be mixed. Among the solvents, propylene glycol monomethyl ether, propylene glycol monomethyl ether acetate, ethyl lactate, butyl lactate, and cyclohexanone are preferred for increasing the leveling property.

As resists to be coated as an upper layer of the anti-reflective coating formed by using the composition of the present invention, any of negative type and positive type resists may be used and such a resist includes a positive type resist consisting of a novolak resin and 1,2-naphthoquinone diazide sulfonic acid ester, a chemically-amplified type resist which consists of a photoacid generator and a binder having a group which is decomposed with an acid and increases alkali dissolution rate, a chemically-amplified type resist consisting of an alkali-soluble binder, a photoacid generator, and a low molecular compound which is decomposed with an acid and increases the alkali dissolution rate of the resist, a chemically-amplified resist consisting of a photoacid generator, a binder having a group which is decomposed with an acid and increases the alkali dissolution rate, and a low molecular compound which is decomposed with an acid and increases the alkali dissolution rate of the resist, for example a resist of trade name APEX-E manufactured by Shipley Co., Inc.

As the developer for the above-mentioned positive type photoresist having the anti-reflective coating for lithography formed by using the anti-reflective coating forming composition of the present invention, use may be made of aqueous solutions of alkalis, e.g., inorganic alkalis such as sodium hydroxide, potassium hydroxide, sodium carbonate, sodium silicate, sodium metasilicate or aqueous ammonia, primary amines such as ethylamine or n-propylamine, secondary amines such as diethylamine or di-n-butylamine, tertiary amines such as triethylamine or methyldiethylamine, alcohol amines such as dimethylethanolamine or triethanolamine, quaternary ammonium salts such as tetramethylammonium hydroxide, tetraethylammonium hydroxide or choline, cyclic amines such as pyrrole or piperidine, etc. Furthermore, a suitable amount of alcohols such as isopropyl alcohol or surfactants such as nonionic surfactant can be added to the aqueous solution of above-described alkalis. Among these, a preferred developer includes quaternary ammonium salts, more preferably tetramethylammonium hydroxide and choline.

The process for manufacturing a semiconductor device by using the anti-reflective material of the present invention and by transferring an image on a substrate and forming an integrated circuit element, comprising the steps (I), (II) and (III) of:

Step (I): a step comprising coating the composition for forming anti-reflective coating on a substrate having holes of an aspect ratio indicated by height/diameter of 1 or more, and drying the composition to fill 20 to 80%, preferably 30 to 70% of a volume of holes on the substrate with the anti-reflective coating;

Step (II): a step comprising coating a resist and drying it; and

Step (III): a step comprising exposing to light, developing and etching.

The conditions of baking after the anti-reflective coating composition is coated are 80 to 250° C. for 1 to 120 minutes.

As mentioned above, the material for forming anti-reflective coating according to the present invention is used for a production of a semiconductor device by a method comprising covering a substrate having holes of an aspect ratio indicated by height/diameter of 1 or more, generally 1 to 50 with a photoresist, and transferring an image on the substrate by utilizing lithography process, and the material can be used for partially filling the holes on the substrate prior to a covering with the photoresist.

In addition, the composition for forming anti-reflective coating according to the present invention can control the rate of crosslinking reaction by adding a halogen atom having a relatively large atom volume in the vicinity of a hydroxy group being a crosslinkable group. In a case where an aromatic hydrocarbon instead of a halogen atom, which makes the rate of crosslinking reaction smaller, is added in the vicinity of a crosslinkable group, the composition for forming anti-reflective coating is difficult to afford a larger dry etching rate compared with a resist. The composition for forming anti-reflective coating in which the above-mentioned halogen-containing resin is used has characteristics that it can appropriately repress the rate of crosslinking reaction and gives a high planarization, and the same time it affords a larger dry etching rate compared with a resist as it can make a concentration of carbon atoms therein low.

The composition for forming anti-reflective coating according to the present invention has no diffusion material in the resist when it is heated and dried, because the light absorbing moiety is linked to the side chain of the polymer. In addition, the composition has a high anti-reflective effect as the light absorbing moiety has fully large absorptivity coefficient, and further the composition does not lead to a lowering of dry etching rate even when an amount of added light absorbing moiety is increased in order to improve absorbance, as carbon forming a ring, such as an aromatic ring in the light absorbing moiety is low in the content ratio (weight ratio).

The composition for forming anti-reflective coating according to the present invention can be used, depending on process condition, as a coating having a function for preventing a light reflection and a function for preventing an interaction between a substrate and a resist or preventing an adverse effect on the substrate by materials constituting the resist or materials generated in exposure to the resist.

In the meantime, in a case where the anti-reflective coating of the present invention is used as a coating excellent in planarization rather than applicability, the light absorptive polymer therein is lowered in glass transition temperature (Tg) and thereby causing a little fluidity on baking and making a completely solidified coating insoluble in a solvent for the resist. For this purpose, crosslinking function of the light absorptive polymer due to heat may be lowered a little. In order to achieve such a planarization, degree of polymerization of the light absorptive polymer, concentration of the light absorptive polymer in the composition, the kind of the repeated unit and the substituents therein, and the kind of comonomers, and the kind of added components are appropriately selected.

BEST MODE FOR CARRYING OUT THE INVENTION

Figure 1:
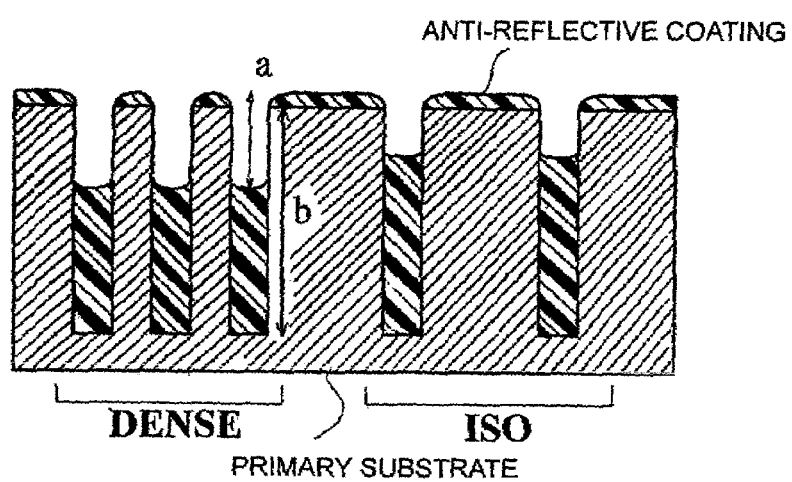
FIG. 1 is a sectional view showing a state where a composition for forming anti-reflective coating is applied on a substrate having holes, wherein a is a recess depth (μm) of the anti-reflective coating at the center of the hole, and b is a depth (μm) of the hole in the substrate on which the anti-reflective coating has not been applied.

Hereinafter, the present invention will be described based on examples.

SYNTHESIS EXAMPLE 1

A halogen-containing novolak epoxy resin (trade name: BREN-304 manufactured by Nippon Kayaku Co., Ltd.) was prepared. The resin had a weight average molecular weigh of 900 and a structure of formula (14).

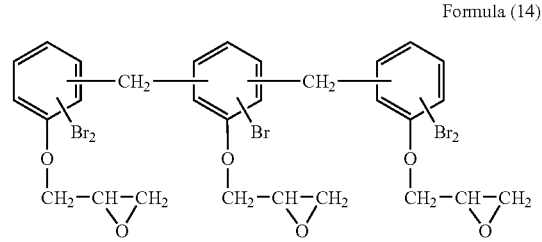

Formula (14)

After 100.0 g of the halogen-containing novolak epoxy resin was dissolved in 251.3 g of propylene glycol monomethyl ether, 67.6 g of 9-anthracenecarboxylic acid and 1.05 g of benzyltriethylammonium chloride were added. These compounds were reacted at 100° C. for 24 hours to obtain a polymer. The resulting polymer was subjected to GPC analysis and had a weight average molecular weight of 1,900 in terms of standard polystyrene. The structure of the resulting resin was shown by formula (15).

Formula (15)

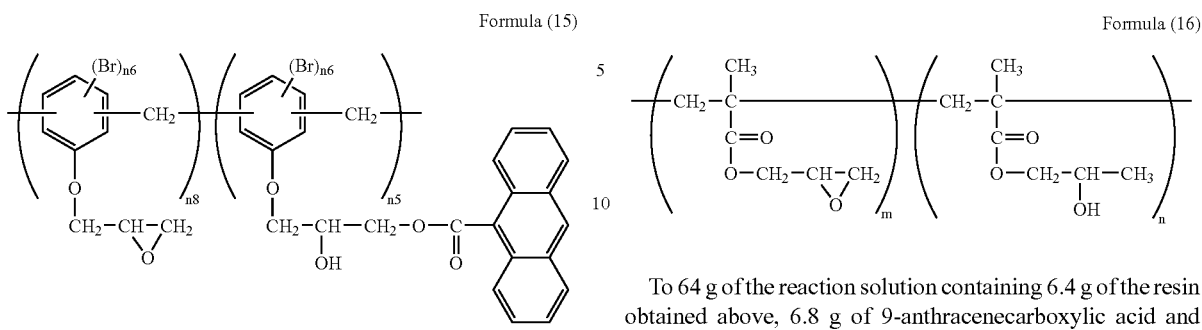

In formula (15), the molar ratio of n8: n5 in the whole polymer was 5:95, and n6 was 1.7.

Formula (16)

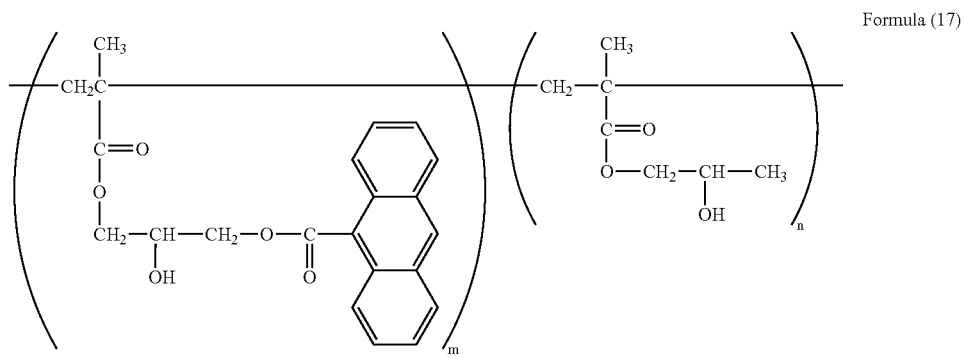

To 64 g of the reaction solution containing 6.4 g of the resin obtained above, 6.8 g of 9-anthracenecarboxylic acid and 0.19 g of benzyltriethylammonium chloride were added, and then these compounds were reacted at 105° C. for 24 hours to obtain a polymer. The resulting polymer was subjected to GPC analysis and had a weight average molecular weight of 53,000 in terms of standard polystyrene. The structure of the resulting resin was shown by formula (17).

Formula (17)

SYNTHESIS EXAMPLE 2

After 26 g of glycidyl methacrylate monomer and 57 g of hydroxypropylmethacrylate were dissolved in 331 g of propylene glycol monomethyl ether to obtain a reaction solution, nitrogen was flowed into the reaction solution for 30 minutes. While the reaction solution was maintained at 70° C., 0.8 g of azobisisobutyronitrile (AIBN) as a polymerization initiator and 0.3 g of 1-dodecanethiol as a chain transfer agent were added therein and stirred under nitrogen atmosphere. After stirring for 24 hours, 0.1 g of 4-methoxyphenol as a short-stop was added therein. The resulting polymer was subjected to GPC analysis and had a weight average molecular weight of 36,400 in terms of standard polystyrene. The solid content in the solution was 20%.

The resulting resin was a copolymer of glycidyl methacrylate with hydroxypropylmethacrylate corresponding to a structure of formula (16), wherein the molar ratio of m: n was 35:65.

SYNTHESIS EXAMPLE 3

As a reaction solution, 300 g of a polymer solution (manufactured by Lancaster Co., Ltd.) in which p-hydroxystyrene monomer was dissolved in 20% by weight of solid concentration in propylene glycol was prepared. Nitrogen was flowed into the reaction solution for 30 minutes. While the reaction solution was maintained at 70° C., 0.1 g of azobisisobutyronitrile (AIBN) as a polymerization initiator was added therein and stirred under nitrogen atmosphere. The reactant was precipitated again in 1 liter of distilled water and the precipitate was filtered and dried to obtain a polymer in a shape of powder. The resulting polymer was subjected to GPC analysis and had a weight average molecular weight of 21,000 in terms of standard polystyrene. The resulting polymer was poly p-vinylphenol corresponding to a structure of formula (18).

Formula (18)

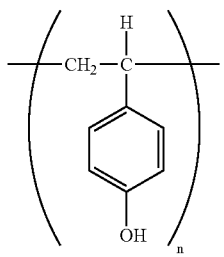

SYNTHESIS EXAMPLE 4

A brominated bisphenol A epoxy resin (trade name: YDB400 manufactured by Touto Chemical Co., Ltd.) was prepared. The resin had a weight average molecular weigh of 1,200 and a structure of formula (19).

Formula (19)

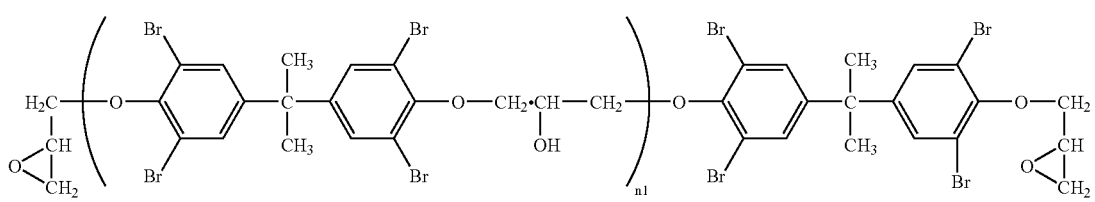

After 60.0 g of the brominated bisphenol A epoxy resin was dissolved in 137.0 g of propylene glycol monomethyl ether, 31.5 g of 9-anthracenecarboxylic acid and 1.1 g of benzyltriethylammonium chloride were added. These compounds were reacted at 100° C. for 24 hours to obtain a polymer. The resulting polymer was subjected to GPC analysis and had a weight average molecular weight of 1,700 in terms of standard polystyrene. The structure of the resulting resin was shown by formula (20).

solution containing 6.8 g of the acrylic resin obtained in Synthesis Example 2, 4.5 g of hexamethoxymethylmelamine as a crosslinking agent, 0.138 g of pyridinium p-toluenesulfonate as a curing agent and 0.30 g of R-30 (manufactured by Dainippon Ink and Chemicals, Inc.) as a surfactant, and dissolved in 292.2 g of ethyl lactate, 137.6 g of propylene glycol monomethyl ether and 53.1 g of cyclohexanone as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 66.7% by weight of novolak resin having a weight average molecular weight of 5,000 or less and 33.3% by weight of acrylic resin having a weight average molecular weight of 20,000 or more. Measurement of the anti-reflective coating by a spectral ellipsometer indicated a refractive index n of 1.61 and an absorptivity coefficient k of 0.51 at 248 nm.

EXAMPLE 2

35.0 g of a solution containing 13.6 g of the bisphenol A resin obtained in Synthesis Example 4 was mixed with 33.9 g of a solution containing 6.8 g of the acrylic resin obtained in Formula (20)

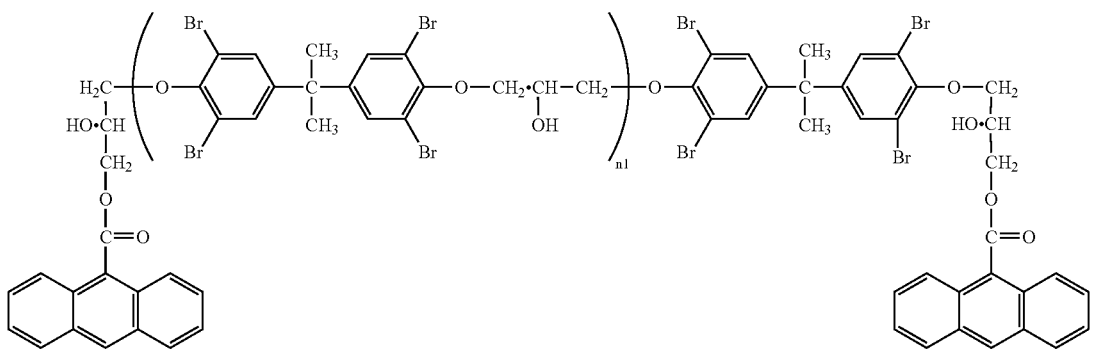

EXAMPLE 1

35.0 g of a solution containing 13.6 g of the novolak resin obtained in Synthesis Example 1 was mixed with 33.9 g of a Synthesis Example 2, 4.5 g of hexamethoxymethylmelamine as a crosslinking agent, 0.138 g of pyridinium p-toluenesulfonate as a curing agent and 0.30 g of R-30 as a surfactant, and dissolved in 292.2 g of ethyl lactate, 137.6 g of propylene glycol monomethyl ether and 53.1 g of cyclohexanone as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 66.7% by weight of bisphenol A resin having a weight average molecular weight of 5,000 or less and 33.3% by weight of acrylic resin having a weight average molecular weight of 20,000 or more. Measurement of the anti-reflective coating by a spectral ellipsometer indicated a refractive index n of 1.59 and an absorptivity coefficient k of 0.49 at 248 nm.

EXAMPLE 3

35.0 g of a solution containing 13.6 g of the novolak resin obtained in Synthesis Example 1 was mixed with 33.3 g of a solution containing 6.7 g of the polyvinyl phenol resin obtained in Synthesis Example 3, 4.5 g of hexamethoxymethylmelamine as a crosslinking agent, 0.138 g of pyridinium p-toluenesulfonate as a curing agent and 0.30 g of R-30 as a surfactant, and dissolved in 292.2 g of ethyl lactate, 137.6 g of propylene glycol monomethyl ether and 53.1 g of cyclohexanone as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 66.7% by weight of novolak resin having a weight average molecular weight of 5,000 or less and 33.3% by weight of polyvinyl phenol resin having a weight average molecular weight of 20,000 or more. Measurement of the anti-reflective coating by a spectral ellipsometer indicated a refractive index n of 1.54 and an absorptivity coefficient k of 0.35 at 248 nm.

EXAMPLE 4

35.0 g of a solution containing 13.6 g of the bisphenol A resin obtained in Synthesis Example 4 was mixed with 33.3 g of a solution containing 6.7 g of the polyvinyl phenol resin obtained in Synthesis Example 3, 4.5 g of hexamethoxymethylmelamine as a crosslinking agent, 0.138 g of pyridinium p-toluenesulfonate as a curing agent and 0.30 g of R-30 as a surfactant, and dissolved in 292.2 g of ethyl lactate, 137.6 g of propylene glycol monomethyl ether and 53.1 g of cyclohexanone as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 66.7% by weight of bisphenol A resin having a weight average molecular weight of 5,000 or less and 33.3% by weight of polyvinyl phenol resin having a weight average molecular weight of 20,000 or more. Measurement of the anti-reflective coating by a spectral ellipsometer indicated a refractive index n of 1.51 and an absorptivity coefficient k of 0.31 at 248 nm.

Comparative Example 1

29.7 g of a solution containing 11.9 g of the resin obtained in Synthesis Example 1 was mixed with 2.76 g of hexamethoxymethylmelamine as a crosslinking agent, 0.193 g of pyridinium p-toluenesulfonate as a curing agent and 0.060 g of R-30 as a surfactant, and dissolved in 99.8 g of ethyl lactate, 42.8 g of butyl lactate, 67.8 g of propylene glycol monomethyl ether and 57.0 g of cyclohexanone as solvents to obtain a 5.0% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 100% of novolak resin having a weight average molecular weight of 5,000 or less. Measurement of the anti-reflective coating by a spectral ellipsometer indicated a refractive index n of 1.65 and an absorptivity coefficient k of 0.53 at 248 nm.

Comparative Example 2

10 g of a solution containing 2.0 g of the resin obtained in Synthesis Example 2 was mixed with 0.264 g of hexamethoxymethylmelamine as a crosslinking agent and 0.010 g of p-toluenesulfonic acid as a curing agent, and dissolved in 14.48 g of propylene glycol monomethyl ether acetate and 25.77 g of propylene glycol monomethyl ether as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 100% of acrylic resin having a weight average molecular weight of 20,000 or more. Measurement of the anti-reflective coating by a spectral ellipsometer indicated a refractive index n of 1.50 and an absorptivity coefficient k of 0.48 at 248 nm.

Comparative Example 3

15.0 g of a solution containing 6.1 g of the novolak resin obtained in Synthesis Example 1 was mixed with 71.0 g of a solution containing 14.2 g of the acrylic resin obtained in Synthesis Example 2, 4.5 g of hexamethoxymethylmelamine as a crosslinking agent, 0.138 g of pyridinium p-toluenesulfonate as a curing agent and 0.30 g of R-30 as a surfactant, and dissolved in 292.2 g of ethyl lactate, 122.6 g of propylene glycol monomethyl ether and 53.1 g of cyclohexanone as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 30% by weight of novolak resin having a weight average molecular weight of 5,000 or less and 70% by weight of acrylic resin having a weight average molecular weight of 20,000 or more. Measurement of the anti-reflective coating by a spectral ellipsometer indicated a refractive index n of 1.61 and an absorptivity coefficient k of 0.51 at 248 nm.

Comparative Example 4

45.0 g of a solution containing 18.0 g of the novolak resin obtained in Synthesis Example 1 was mixed with 14.7 g of a solution containing 2.93 g of the acrylic resin obtained in Synthesis Example 2, 4.5 g of hexamethoxymethylmelamine as a crosslinking agent, 0.138 g of pyridinium p-toluene-sulfonate as a curing agent and 0.30 g of R-30 as a surfactant, and dissolved in 292.2 g of ethyl lactate, 146.6 g of propylene glycol monomethyl ether and 53.1 g of cyclohexanone as solvents to obtain a 4.5% solution. Then, the solution was filtered through a micro filter made of polyethylene having a pore diameter of 0.10 μm, and then, the solution was filtered through a micro filter made of polyethylene having a pore diameter of 0.05 μm, to prepare an anti-reflective coating composition. The solution was coated on a silicon wafer using a spinner and the wafer was heated at 205° C. for 1 minute on a hot plate to form an anti-reflective coating (film thickness: 0.080 μm).

The polymers in the resulting anti-reflective coating were consisted of 86.0% by weight of novolak resin having a weight average molecular weight of 5,000 or less and 14.0% by weight of acrylic resin having a weight average molecular weight of 20,000 or more. Measurement of the anti-reflective coating by a spectral ellipsometer indicated a refractive index n of 1.61 and an absorptivity coefficient k of 0.51 at 248 nm.

The solutions obtained in Examples 1 to 4 and Comparative Examples 1 to 4 were coated on silicon wafers by means of a spinner. The coated silicon wafers were heated at 205° C. for 1 minute on a hot plate to form anti-reflective coatings (film thickness: 0.080 μm). The anti-reflective coatings were dipped in a solvent used for resists, for example, ethyl lactate and propylene glycol monomethyl ether and as a result it was confirmed that these coatings were insoluble in these solvents.

The solutions obtained in Examples 1 to 4 and Comparative Examples 1 to 4 were coated on silicon wafers by means of a spinner. The coated silicon wafers were heated at 205° C. for 1 minute on a hot plate to form anti-reflective coatings (film thickness 0.080 μm) and film thickness was measured. On each anti-reflective coating for lithography was coated a commercially available resist solution (trade name: APEX-E or the like manufactured by Shipley Co., Ltd.) by means of a spinner. The coated wafers were heated at 90° C. for 1 minute on a hot plate. After exposure of the resists to light, post exposure bake was performed at 90° C. for 1.5 minutes. After developing the resists, the film thickness of the anti-reflective coatings was measured and as a result it was confirmed that no intermixing occurred between the anti-reflective coatings for lithography obtained in Examples 1 to 4 and Comparative Examples 1 to 4 and the resist layers.

The solutions of compositions for forming anti-reflective coating obtained above were coated on silicon wafers having holes (diameter: 0.20 μm, depth: 1.0 μm) by means of a spinner. The coated silicon wafers were heated at 205° C. for 1 minute on a hot plate to form anti-reflective coatings (film thickness: c.a. 0.080 μm). The applicability of the anti-reflective coatings to substrates having holes was evaluated by observing sectional shape of silicon wafer substrates having holes on which the anti-reflective coatings were applied.

The applicability to substrates having holes was evaluated on the following items.

Test No. (1) is a test in which filling rate (% by volume) of an anti-reflective coating into holes is determined. The criteria for evaluation are as follows: a case where the filling rate falls in 30 to 70% is indicated by the mark "⊚"; a case where the filling rate falls in 20 to 30% or 70-80% is indicated by the mark "○"; and a case where the filling rate falls in a range other than the above (that is 0-20% or 80-100%) is indicated by the mark "X".

Test No. (2) confirms whether or not there are voids or gaps of air in holes. The criteria for evaluation are as follows: a case where there is no voids or gaps is indicated by the mark "⊚"; and a case where there are voids or gaps is indicated by the mark "X".

Test No. (3) is a measurement of thickness of anti-reflective coating adhered to side walls of holes. The criteria for evaluation are as follows: a case where the thickness is 20 nm or less is indicated by the mark "⊚"; a case where the thickness is 20 to 40 nm is indicated by the mark "○"; and a case where the thickness is 40 nm or more is indicated by the mark "X".

Test No. (4) is a measurement of thickness of anti-reflective coating at upper parts of hole edges. The criteria for evaluation are as follows: a case where the thickness is 40 nm or more is indicated by the mark "⊚"; a case where the thickness is 20 to 40 nm is indicated by the mark "○"; and a case where the thickness is 20 nm or less is indicated by the mark "X".

Test No. (5) is a measurement of difference of coating-thickness between DENSE and ISO parts of holes on substrate. The criteria for evaluation are as follows: a case where the difference is 40 nm or less is indicated by the mark "⊚"; a case where the difference is 40 to 60 nm is indicated by the mark "○"; and a case where the difference is 60 nm or more is indicated by the mark "X".

The filling rate was calculated according to the following equation. The filling rate was 100% when the holes on the substrate were completely planarized.

Filling Rate=[1−(recess depth ($a$) of anti-reflective coating at the center of hole)/(depth ($b$) of hole)]×100

The substrate subjected to the test is a silicon wafer substrate having Iso and Dense patterns of holes as shown in FIG. 1. The Iso pattern is a pattern in which the distance between the center of a hole and the center of the adjacent hole is three times the diameter of the holes. The Dense pattern is a pattern in which the distance between the center of a hole and the center of the adjacent hole equals to the diameter of the holes. The depth of hole is 1.0 μm and the diameter of hole is 0.20 μm.

TABLE 1

| Test No. | 1 | 2 | 3 | 4 | 5 |
|---|---|---|---|---|---|
| Example 1 | ⊚ | ⊚ | ⊚ | ⊚ | ⊚ |
| Example 2 | ⊚ | ⊚ | ⊚ | ⊚ | ○ |

TABLE 1-continued

| Test No. | 1 | 2 | 3 | 4 | 5 |
|---|---|---|---|---|---|
| Example 3 | ◎ | ◎ | ◎ | ○ | ○ |
| Example 4 | ◎ | ◎ | ◎ | ○ | ○ |
| Comparative Example 1 | X | ◎ | ◎ | X | X |
| Comparative Example 2 | ○ | X | X | ◎ | ◎ |
| Comparative Example 3 | ○ | X | ○ | ○ | ◎ |
| Comparative Example 4 | X | ◎ | ○ | X | ○ |

As to Test No. (1), the filling rate (% by volume) was 80 to 100% in Comparative Examples 1 and 4, and the filling rate (% by volume) was 20 to 30% in Comparative Examples 2 and 3.

It became clear that Examples 1 to 4 fulfill required characteristics compared with Comparative Examples 1 to 4. This is due to that the base polymer in compositions for forming anti-reflective coating in Examples 1 to 4 is a mixture of polymers comprising a polymer with a molecular weight of 5,000 or less and a polymer with a molecular weight of 20,000 or more in a specific ratio.

The present invention relates to compositions for forming anti-reflective coatings by which control of applicability on substrates having holes is aimed. The resulting anti-reflective coatings are effective in not only anti-reflection of the substrates but also protection of material of hole bottom in etching process or ashing process.

The present invention provides compositions for forming anti-reflective coating which is excellent in step coverage on a substrate with an irregular surface, such as hole or trench, has a higher dry etching rate compared with the resist layer and a high anti-reflection, and further causes no intermixing with a resist layer nor diffusion into the resist during drying under heating, and has a high resolution and an excellent film thickness-dependence; and a method for forming an excellent resist pattern. Further, the present invention provides also excellent methods for forming resist patterns.

The invention claimed is:

1. A composition for forming anti-reflective coating for use in a lithography process in the manufacture of a semiconductor device, comprising a polymer (A) being a halogenated bisphenol A resin having a weight average molecular weight of 700 to 5,000, and a polymer (B) comprising a crosslink-forming functional group and having a weight average molecular weight of 20,000 or more; wherein the halogenated bisphenol A resin comprises at least a polymer of formula (1):

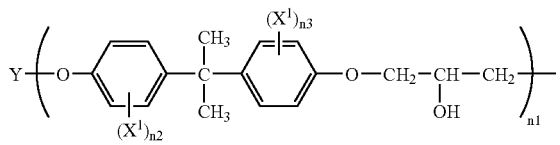

Formula (1)

wherein $X^1$ is a halogen atom, n1 is the number of repeated units and an integer of 1 to 50, n2 and n3 is the number of substituent $X^1$ on a benzene ring and an integer of 1 to 3, and Y is a group of formula (2)

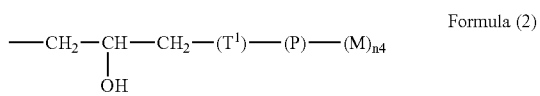

Formula (2)

wherein $T^1$ is a divalent linking group, P is a (n4+1) valent aromatic ring group having 6 to 14 carbon atoms, M is an electron-donating group, n4 is the number of substituent M on P and an integer of 0 to 3, in a case where n4 is 2 or 3, substituents M are the same or different from each other.

2. The composition for forming anti-reflective coating according to claim 1, wherein the polymer (B) is a polyacrylate or polymethacrylate having a weight average molecular weight of 20,000 to 200,000.

3. The composition for forming anti-reflective coating according to claim 1, wherein the polymer (B) is a polystyrene or a derivative thereof having a weight average molecular weight of 20,000 to 200,000.

4. The composition for forming anti-reflective coating according to claim 1, further containing a crosslinking agent having at least two crosslink-forming functional groups.

5. The composition for forming anti-reflective coating according to claim 1, wherein the composition is used for a production of a semiconductor device by a method comprising covering a substrate having holes of an aspect ratio indicated by height/diameter of 1 or more with a photoresist, and transferring an image on the substrate by utilizing a lithography process, and the composition is used for partially filling the holes on the substrate prior to a covering with the photoresist.

6. The composition for forming anti-reflective coating according to claim 5, consisting essentially of a base polymer consisting of: the polymer (A) in an amount of 33.7 to 83.2% by weight and the polymer (B) in an amount of 66.3 to 16.8% by weight, the amounts of (A) and (B) totaling 100% by weight of said base polymer; wherein the filling of the holes is carried out in a rate of 20 to 80% based on a volume per hole.

7. A process for manufacturing a semiconductor device by transferring an image on a substrate and forming an integrated circuit element, comprising the steps (I), (II) and (III) of:

Step (I): a step comprising coating the composition for forming anti-reflective coating according to claim 1 on a substrate having holes of an aspect ratio indicated by height/diameter of 1 or more, and drying the composition to fill 20 to 80% of a volume of holes on the substrate with the anti-reflective coating;

Step (II): a step comprising coating a resist and drying it; and

Step (III): a step comprising exposing to light, developing and etching; wherein the composition consists essentially of a base polymer consisting of: the polymer (A) in an amount of 33.7 to 83.2% by weight and the polymer (B) in an amount of 66.3 to 16.8% by weight, the amounts of (A) and (B) totaling 100% by weight of said base polymer.

8. A composition for forming anti-reflective coating for use in a lithography process in the manufacture of a semiconductor device, comprising a polymer (A) being a halogen-containing novolak resin having a weight average molecular weight of 600 to 5,000, and a polymer (B) comprising a crosslink-forming functional group and having a weight average molecular weight of 20,000 or more; and wherein the halogen-containing novolak resin is a polymer having at least a repeated unit of formula (3):

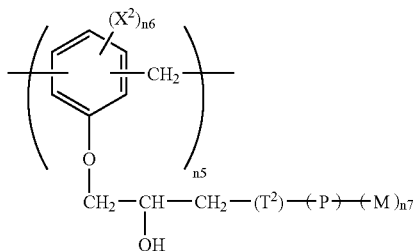

Formula (3)

wherein $T^2$ is a divalent linking group $X^2$ is chlorine atom or bromine atom, n5 is the number of repeated units, n6 is the number of substituent $X^2$ on a benzene ring and an integer of 1 to 3, P is a (n7+1) valent aromatic ring group having 6 to 14 carbon atoms, M is an electron-donating group, n7 is an integer of 0 to 3, in a case where n7 is 2 or 3, substituents M are the same or different from each other.

9. The composition for forming anti-reflective coating according to claim 8, wherein the polymer (B) is a polyacrylate or polymethacrylate having a weight average molecular weight of 20,000 to 200,000.

10. The composition for forming anti-reflective coating according to claim 8, wherein the polymer (B) is a polystyrene or a derivative thereof having a weight average molecular weight of 20,000 to 200,000.

11. The composition for forming anti-reflective coating according to claim 8, further containing a crosslinking agent having at least two crosslink-forming functional groups.

12. The composition for forming anti-reflective coating according to claim 8, wherein the composition is used for a production of a semiconductor device by a method comprising covering a substrate having holes of an aspect ratio indicated by height/diameter of 1 or more with a photoresist, and transferring an image on the substrate by utilizing a lithography process, and the composition is used for partially filling the holes on the substrate prior to a covering with the photoresist.

13. The composition for forming anti-reflective coating according to claim 12, consisting essentially of a base polymer consisting of: the polymer (A) in an amount of 33.7 to 83.2% by weight and the polymer (B) in an amount of 66.3 to 16.8% by weight, the amounts of (A) and (B) totaling 100% by weight of said base polymer; wherein the filling of the holes is carried out in a rate of 20 to 80% based on a volume per hole.

14. A process for manufacturing a semiconductor device by transferring an image on a substrate and forming an integrated circuit element, comprising the steps (I), (II) and (III) of:
Step (I): a step comprising coating the composition for forming anti-reflective coating according to claim 8 on a substrate having holes of an aspect ratio indicated by height/diameter of 1 or more, and drying the composition to fill 20 to 80% of a volume of holes on the substrate with the anti-reflective coating;
Step (II): a step comprising coating a resist and drying it; and
Step (III): a step comprising exposing to light, developing and etching, wherein the composition consists essentially of a base polymer consisting of: the polymer (A) in an amount of 33.7 to 83.2% by weight and the polymer (B) in an amount of 66.3 to 6.8% by weight, the amounts of (A) and (B) totaling 100% by weight of said base polymer.

15. A composition for forming anti-reflective coating for use in a lithography process in the manufacture of a semiconductor device, said composition consisting essentially of a base polymer consisting of: a polymer (A) having a weight average molecular weight of 5,000 or less in an amount of 33.7 to 83.2% by weight, and a polymer (B) having a weight average molecular weight of 20,000 or more in an amount of 66.3 to 16.8% by weight and containing a crosslink-forming functional group; wherein the amounts of (A) and (B) total 100% by weight of said base polymer; and wherein at least one of the polymer (A) and the polymer (B) further has a light absorbing moiety; said light absorbing moiety comprising a terminal or pendant aromatic ring group having 6 to 14 carbon atoms, optionally substituted with up to three electron donating groups.

16. A process for manufacturing a semiconductor device by transferring an image on a substrate and forming an integrated circuit element, comprising the steps (I), (II) and (III) of:
Step (I): a step of coating the composition for forming anti-reflective coating according to claim 15 on a substrate having holes of an aspect ratio indicated by height/diameter of 1 or more, and drying the composition to fill 20 to 80% of a volume of holes on the substrate with the anti-reflective coating;
Step (II): a step comprising coating a resist and drying it; and
Step (III): a step comprising exposing to light, developing and etching.

* * * * *